United States Patent
Hsieh et al.

(10) Patent No.: US 8,690,041 B2
(45) Date of Patent: Apr. 8, 2014

(54) METHOD AND SOLDERING SYSTEM OF SOLDERING A DIP COMPONENT ON A CIRCUIT BOARD

(75) Inventors: Hao-Chun Hsieh, New Taipei (TW); Chia-Hsien Lee, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 6 days.

(21) Appl. No.: 13/323,837

(22) Filed: Dec. 13, 2011

(65) Prior Publication Data

US 2012/0193400 A1    Aug. 2, 2012

(30) Foreign Application Priority Data

Jan. 28, 2011    (TW) .............................. 100103311 A

(51) Int. Cl.
*B23K 31/00*    (2006.01)
*B23K 31/02*    (2006.01)

(52) U.S. Cl.
USPC .................... 228/178; 228/179.1; 228/180.1; 228/180.21; 228/180.22; 228/245; 228/246; 228/247; 228/249

(58) Field of Classification Search
USPC ....................... 228/178–180.22, 245–255, 37
See application file for complete search history.

(56) References Cited

U.S. PATENT DOCUMENTS

| | | | |
|---|---|---|---|
| 3,882,596 A | 5/1975 | Kendziora | |
| 3,982,887 A * | 9/1976 | Kendziora et al. | 432/128 |
| 5,573,688 A * | 11/1996 | Chanasyk et al. | 219/388 |
| 5,770,835 A * | 6/1998 | Sakuyama et al. | 219/388 |
| 7,562,806 B2 | 7/2009 | Shiozawa | |
| 2002/0179693 A1 * | 12/2002 | Kawashima et al. | 228/232 |
| 2006/0008759 A1 * | 1/2006 | Shiozawa | 432/121 |
| 2006/0239855 A1 | 10/2006 | Nakatsuka | |

FOREIGN PATENT DOCUMENTS

| | | |
|---|---|---|
| CN | 1817071 A | 8/2006 |
| CN | 101707857 A | 5/2010 |

OTHER PUBLICATIONS

Office action mailed on Mar. 7, 2013 for the Taiwan application No. 100103311, filing date: Jan. 28, 2011, p. 2 line 3~23 and line 25~26, p. 3 line 2~3, line 7~10, line 13~14, line 18~19 and line 23, p. 4 line 1~5, line 9~10, line 12, line 16~18, line 20 and line 25~26, p. 5 line 1~7, line 13~17, line 21 and line 25~26, p. 6 line 1~2, line 6, line 10~13, line 15~16, line 18~19 and line 23~24, p. 7 line 1, line 5~6, line 9, line 13~16, line 20~22 and line 24 and p. 8 line 3~5 and line 7.
Office action mailed on Aug. 14, 2013 for the Taiwan application No. 100103311, filing date: Jan. 29, 2011, p. 2 line 5~26, p. 3 line 1~2 and line 19~22, p. 4 line 4~5, line 13~14 and 21~22, p. 5 line 2~4 and line 11~26, p. 6 line 1~19 and line 21~23, p. 7 line 7~10 and line 20~21, p. 8 line 2~3 and line 11~20, and p. 9 line 1~3.

(Continued)

*Primary Examiner* — Erin Saad
(74) *Attorney, Agent, or Firm* — Winston Hsu; Scott Margo

(57) ABSTRACT

A method of soldering a DIP component on a circuit board includes piercing the DIP component through the circuit board, laying fluxer on the circuit board, passing a first surface of the circuit board through a boiler so that molten tin from the boiler flows between the DIP component and the circuit board through the first surface of the circuit board, and heating a second surface of the circuit board different from the first surface so as to increase temperature of the second surface by a thermal radiation heating device to when the first surface of the circuit board passes through the boiler.

4 Claims, 5 Drawing Sheets

(56) References Cited

OTHER PUBLICATIONS

Office action mailed on Jan. 2, 2014 for the China application No. 201110047629.8, p. 3 line 4~31, p. 4 and p. 5 line 1~4.

* cited by examiner

METHOD AND SOLDERING SYSTEM OF SOLDERING A DIP COMPONENT ON A CIRCUIT BOARD

BACKGROUND OF THE INVENTION

1. Field of the Invention

The present invention relates to a method and a soldering system of soldering a DIP component on a circuit board, and more particularly, to a method and a soldering system capable of increasing temperature of the circuit board by thermal radiation for soldering the DIP component on the circuit board.

2. Description of the Prior Art

There are two common types of print circuit board assembly (PCBA) process, surface mount technology (SMT) and direct insertion process (DIP). The conventional direct insertion process includes piercing a DIP component through a circuit board, laying fluxer on the circuit board, preheating the circuit board, and flowing molten tin between the DIP component and the circuit board by a boiler. Furthermore, the circuit board is preheated by a preheater before the circuit board enters into the boiler. The preheater can be an infrared preheater or a convection preheater. The preheater is for increasing temperature of the circuit board, and then the track conveys the circuit board to the boiler. Generally, a surface of the circuit board facing the boiler is a soldering surface, and the other surface of the circuit board opposite to the soldering surface is a heat-dissipating surface. When the molten tin from the boiler flows between the DIP component and the circuit board through the soldering surface of the circuit board, heat from the circuit board is dissipated through the dissipating surface excessively. The molten tin can not flow deeply into a gap between the DIP component and the circuit board due to large temperature difference between two surfaces of the circuit board, so that soldering efficiency of the molten tin inside the circuit board and soldering quality of the conventional direct insertion process are decreased. Thus, design of a system capable of keeping uniform temperature between the two surfaces of the circuit board is an important issue in the PCBA process.

SUMMARY OF THE INVENTION

The present invention provides a method and a soldering system capable of increasing temperature of the circuit board by thermal radiation for soldering the DIP component on the circuit board for solving above drawbacks.

According to the claimed invention, a method of soldering a direct insertion process (DIP) component on a circuit board includes piercing the DIP component through a circuit board, laying fluxer on the circuit board, passing a first surface of the circuit board through a boiler so that molten tin from the boiler flows between the DIP component and the circuit board through the first surface of the circuit board, and heating a second surface of the circuit board different from the first surface by a thermal radiation heating device for increasing temperature of the second surface when the first surface of the circuit board passes through the boiler.

According to the claimed invention, the method further includes disposing a shelter between the thermal radiation heating device and the circuit board as the thermal radiation heating device heats the second surface of the circuit board.

According to the claimed invention, the method further includes utilizing a position sensor to detect a position of the circuit board relative to the boiler, and utilizing a driving device to move the shelter and the thermal radiation heating device relative to the circuit board according to a detecting result of the position sensor.

According to the claimed invention, heating the second surface of the circuit board by the thermal radiation heating device comprises heating an area on the second surface of the circuit board adjacent to the DIP component through a hole on the shelter by the thermal radiation heating device.

According to the claimed invention, the method further includes actuating a cleaner to exhaust smoke generated from the boiler when the first surface of the circuit board passes through the boiler.

According to the claimed invention, the method further includes preheating the circuit board by a preheater before the circuit board passes through the boiler.

According to the claimed invention, preheating temperature of the circuit board by the preheater is smaller than heating temperature of the circuit board by the thermal radiation heating device.

According to the claimed invention, a soldering system for direct insertion process includes a track for transmitting a circuit board, at least one DIP component piercing through the circuit board, a laying device disposed on a first section of the track for laying fluxer on the circuit board, a boiler disposed on a second section of the track for providing molten tin to flow between the DIP component and the circuit board through a first surface of the circuit board when the first surface of the circuit board passes through the boiler, and a thermal radiation heating device disposed on the second section of the track and opposite to the boiler for heating a second surface of the circuit board different from the first surface so as to increase temperature of the second surface.

According to the claimed invention, the soldering system further includes a shelter disposed between the thermal radiation heating device and the circuit board, at least one hole being formed on the shelter, and a transmission roller disposed on a side of the shelter for rotating the shelter according to a transmission speed of the track.

According to the claimed invention, a shape and a dimension of the hole on the shelter corresponds to a shape and a dimension of the DIP component.

According to the claimed invention, the soldering system further includes a position sensor disposed on a side of the track for detecting a position of the circuit board relative to the boiler, and a driving device electrically connected to the position sensor for moving the shelter and the thermal radiation heating device relative to the circuit board according to a detecting result of the position sensor.

According to the claimed invention, the thermal radiation heating device heats an area on the second surface of the circuit board adjacent to the DIP component through the hole on the shelter.

According to the claimed invention, the soldering system further includes a preheater disposed between the first section and the second section of the track for preheating the circuit board before the circuit board passes through the boiler.

According to the claimed invention, the preheater is a convection preheater.

According to the claimed invention, heating temperature of the circuit board by the preheater is smaller than heating temperature of the circuit board by the thermal radiation heating device.

According to the claimed invention, the soldering system further includes a cleaner disposed on the second section of the track for exhausting smoke generated from the boiler.

The soldering system of the present invention utilizes the thermal radiation heating device to accurately heat the area on the circuit board around the DIP component through the holes on the shelter when the molten tin from the boiler flows between the circuit board and the DIP component, and utilizes the position sensor and the driving device to move the thermal radiation heating device and the shelter relative to the circuit board, so that the thermal radiation heating device can continuously heat the soldering area on the circuit board for increasing the soldering efficiency of the soldering system of the present invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
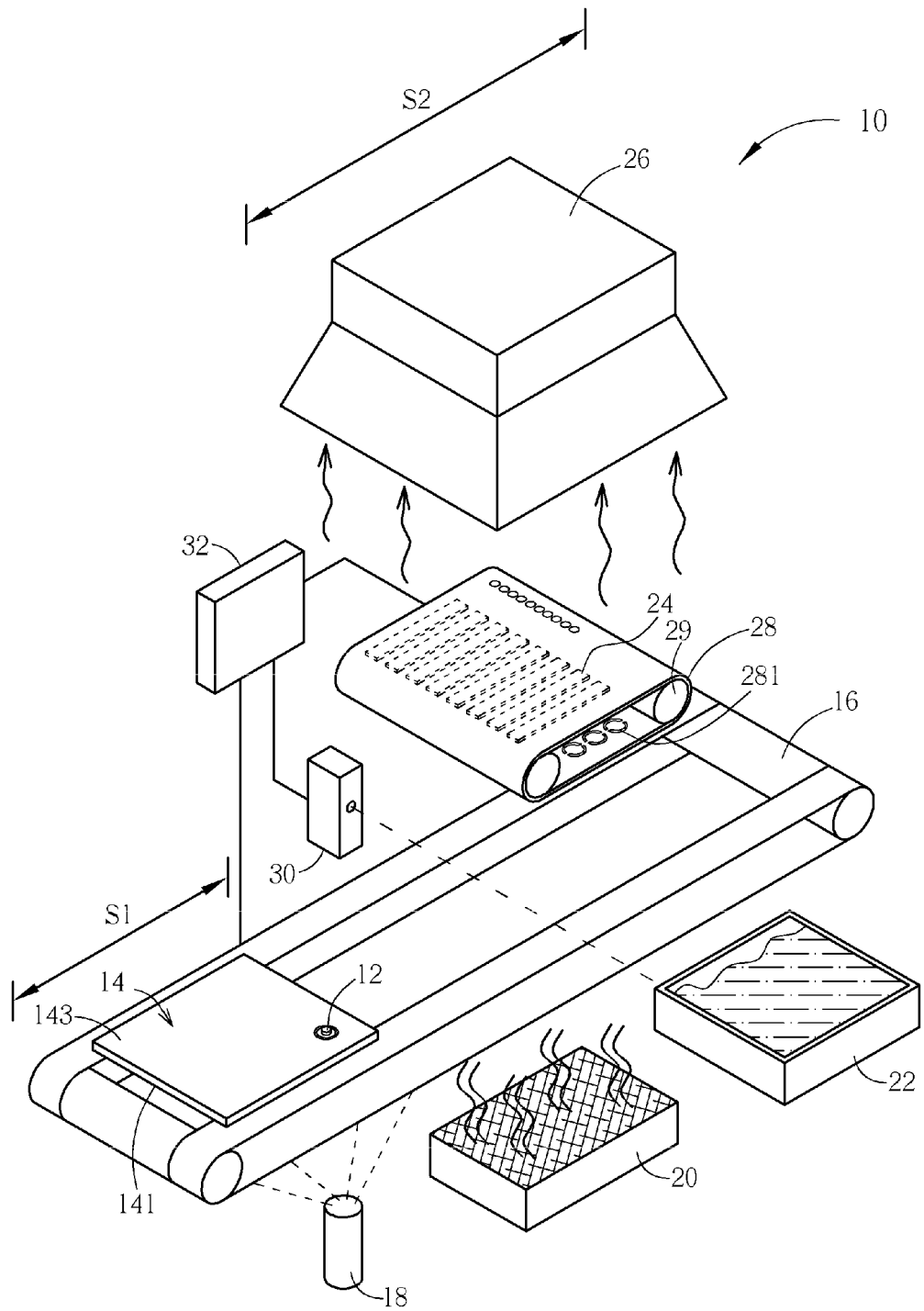
FIG. 1 is a diagram of a soldering system for DIP process according to an embodiment of the present invention.
Figure 2:
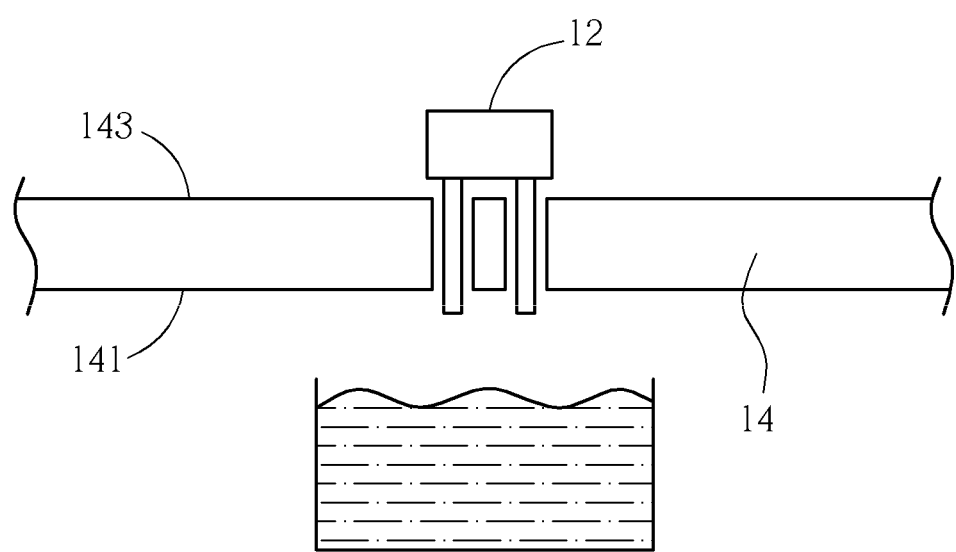
FIG. 2 is a sectional view of a DIP component piercing through a circuit board according to the embodiment of the present invention.

Please refer to FIG. 1. FIG. 1 is a diagram of a soldering system 10 for DIP process according to an embodiment of the present invention. The soldering system 10 is for soldering a DIP component 12 on a circuit board 14. The soldering system 10 includes a track 16, a laying device 18, a preheater 20, a boiler 22 and a thermal radiation heating device 24. Please refer to FIG. 2. FIG. 2 is a sectional view of the DIP component 12 piercing through the circuit board 14 according to the embodiment of the present invention. The track 16 can be a conveyor belt, which is inclined relative to a horizontal plane about 5-7 degrees, for conveying the circuit board 14 to the boiler 22. At least one DIP component 12 pierces through the circuit board 14 before starting the DIP process. The laying device 18 is disposed on a first section S1 of the track 16 for laying fluxer on the circuit board 14 when the circuit board 14 wherethrough the DIP component 12 pierces is conveyed to the first section S1 by the track 16, so as to solder the DIP component 12 on the circuit board 14 easily. Then, the circuit board 14 passes through the preheater 20 for increasing temperature of the circuit board 14, so as to enhance soldering efficiency of the DIP process. The preheater 20 can be a convection preheater or an infrared preheater.

Boiler 22 of the soldering system 10 is disposed on a second section S2 of the track 16 different from the first section S1. The circuit board 14 is conveyed to the second section S2 by the track 16 after the circuit board 14 is preheated, and then a first surface 141 of the circuit board 14 passes through the boiler 22. The boiler 22 provides molten tin to flow between the DIP component 12 and the circuit board 14 through the first surface 141 of the circuit board 14. The thermal radiation heating device 24 is disposed on the second section S2 of the track 16 and opposite to the boiler 22 for heating a second surface 143 of the circuit board 14 different from the first surface 141 when the circuit board 14 is located at the second section S2 of the track 16, so as to increase temperature of the second surface 143 for increasing the solder efficiency of the molten tin inside the circuit board 14 in the DIP process. The preheater 20 is disposed between the first section S1 and the second section S2 of the track 16 for preheating the circuit board 14. Upper limit of preheating temperature of the preheater 20 is around 120° C. The thermal radiation heating device 24 heats an area on the circuit board 14 adjacent to the DIP component 12, and upper limit of heating temperature of the thermal radiation heating device 24 is around 268° C. Preheating temperature of the preheater 20 is substantially smaller than heating temperature of the thermal radiation heating device 24.

The soldering system 10 can further includes a cleaner 26 disposed on the second section S2 of the track 16 for exhausting smoke generated from the boiler 22. The soldering system 10 can further includes a shelter 28 disposed between the thermal radiation heating device 24 and the circuit board 14. At least one hole 281 can be formed on the shelter 28. A shape and a dimension of the hole 281 on the shelter 28 can correspond to a shape and a dimension of the DIP component 12. For example, as a top of the DIP component 12 has a circular form, the hole 281 can conform to the annular form and the diameter of the annular hole 281 can be slightly greater than the diameter of the top of the DIP component 12, so that the DIP component 12 can be covered by the shelter 28 without being heated by the thermal radiation heating device 24. The thermal radiation heating device 24 heats non-heatproof components or non-plastic parts of the DIP component 12 (such as metal pins of the DIP component 12) on the circuit board 14, which means the thermal radiation heating device 24 heats heatproof parts of the DIP component 12 (such as metal pins) or areas on the circuit board abound the DIP component 12 (such as a circular area around the DIP component 12 in FIG. 1). The soldering system 10 can further includes a transmission roller 29 disposed on a side of the shelter 28 for rotating the shelter 28 according to a conveying speed of the circuit board 14 by the track 16, so as to align the hole 281 on the shelter 28 with the area on the circuit board 14 around the DIP component 12.

Figure 3:
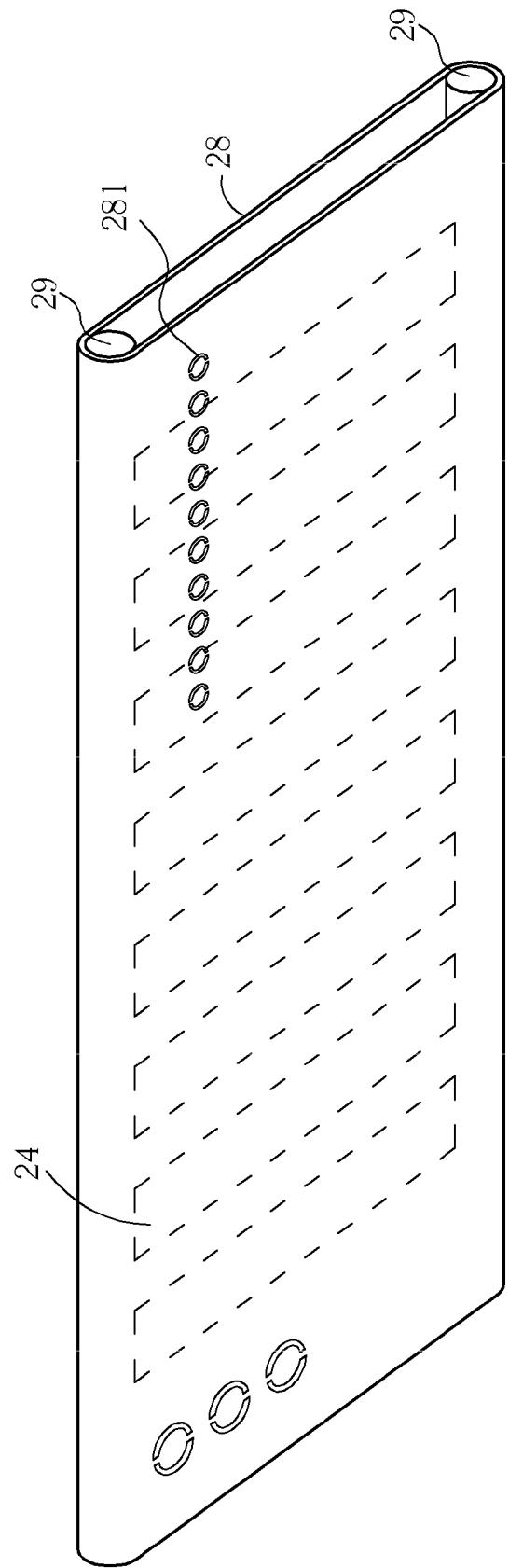
FIG. 3 is an assembly diagram of a thermal radiation heating device and a shelter according to the embodiment of the present invention.
Figure 4:
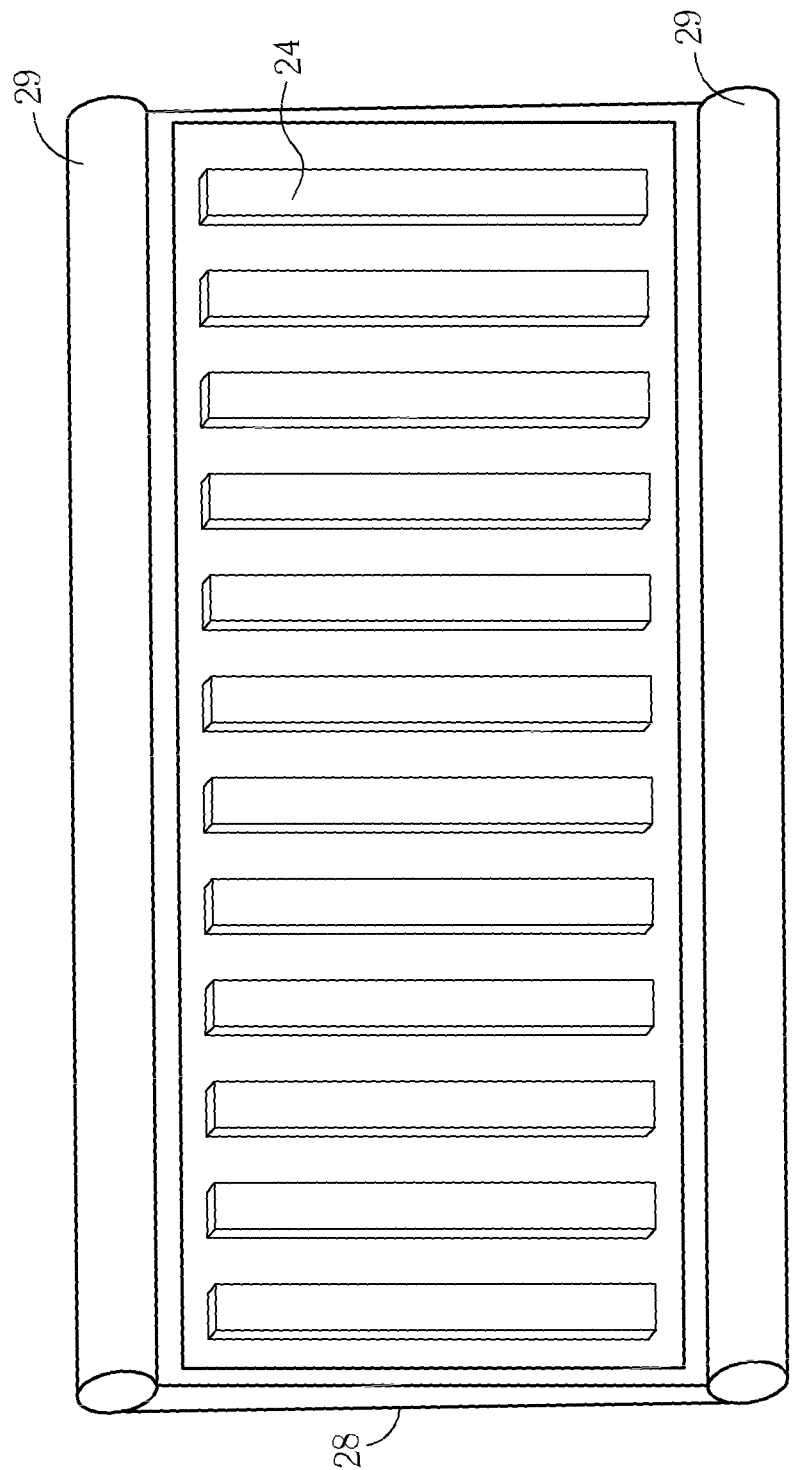
FIG. 4 is a schematic view of the thermal radiation heating device according to the embodiment of the present invention.

Please refer to FIG. 3 and FIG. 4. FIG. 3 is an assembly diagram of the thermal radiation heating device 24 and the shelter 28 according to the embodiment of the present invention. FIG. 4 is a schematic view of the thermal radiation heating device 24 according to the embodiment of the present invention. As shown in FIG. 3 and FIG. 4, the hole 281 can be composed of a plurality of half circular apertures (or a plurality of half square apertures). Shapes of the apertures are not limited to the above-mentioned embodiment, and it depends on actual demand. The shelter 28 can be directly disposed on an outer side of the thermal radiation heating device 24. The thermal radiation heating device 24 can be an infrared heat source for heating through the hole 281 on the shelter 28. The soldering system 10 can further include a position sensor 30 disposed on a side of the track 16 for detecting a position of the circuit board 14 relative to the boiler 22. The soldering system 10 can further include a driving device 32 electrically connected to the position sensor 30 for moving the shelter 28 and the thermal radiation heating device 24 relative to the circuit board 14 according to a detecting result of the position sensor 30 when the circuit board 14 is conveyed to the second section S2 of the track 16 and is sensed by the position sensor 30. Thus, the thermal radiation heating device 24 can heat the area on the second surface 143 of the circuit board 14 around the DIP component 12 through the hole 281 on the shelter 28.

Figure 5:
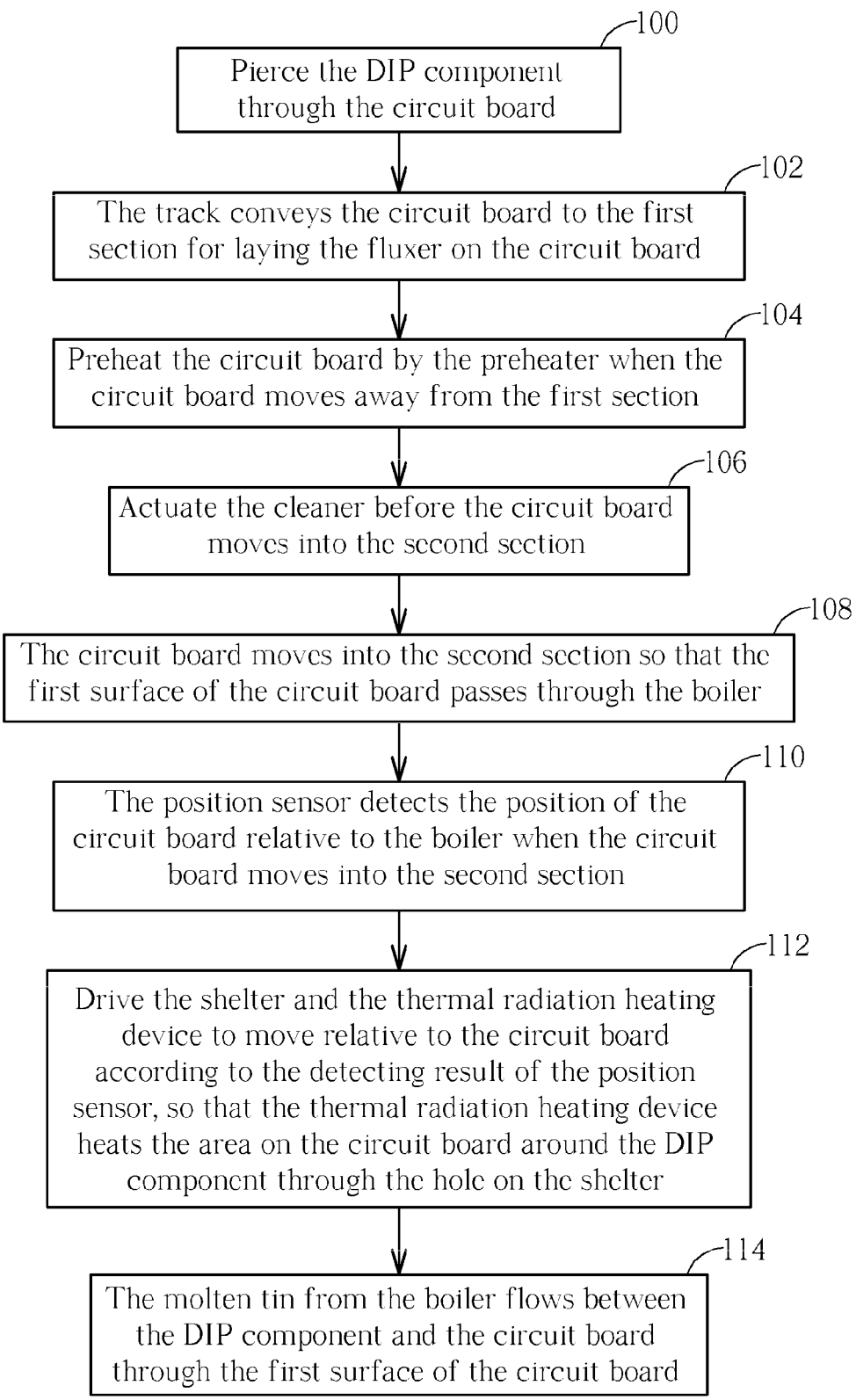
FIG. 5 is a flow chart of a method for the DIP process according to the embodiment of the present invention.

Please refer to FIG. 5. FIG. 5 is a flow chart of a method for the DIP process according to the embodiment of the present invention. The method includes following steps:

Step 100: Pierce the DIP component 12 through the circuit board 12.

Step 102: The track 16 conveys the circuit board 14 to the first section S1 for laying the fluxer on the circuit board 14.

Step 104: Preheat the circuit board 14 by the preheater 20 when the circuit board 14 moves away from the first section S1.

Step 106: Actuate the cleaner 26 before the circuit board 14 moves into the second section S2.

Step 108: The circuit board 14 moves into the second section S2 so that the first surface 141 of the circuit board 14 passes through the boiler 22.

Step 110: The position sensor 30 detects the position of the circuit board 14 relative to the boiler 22 when the circuit board 14 moves into the second section S2.

Step 112: The driving device 32 drives the shelter 28 and the thermal radiation heating device 24 to move relative to the circuit board 14 according to the detecting result of the position sensor 30 so that the thermal radiation heating device 24 heats the area on the circuit board 14 around the DIP component 12 through the hole 281 on the shelter 28.

Step 114: The molten tin from the boiler 22 flows between the DIP component 12 and the circuit board 14 through the first surface 141 of the circuit board 14.

Detailed introduction is described as follows. The DIP component 12 can pierce through the circuit board 14 manually or by an automatic mechanism. The track 16 conveys the circuit board 14 to the first section S1, so as to lay the fluxer on the circuit board 14 by the laying device 18. Before the circuit board 14 enters the boiler 22, which means the circuit board 14 moves away from the first section S1 of the track 16 and does not enter the second section S2 yet, the circuit board 14 is preheated by the preheater 20 for increasing the soldering efficiency of the DIP process. Generally, the preheater 20 can be an infrared preheater or a thermal convection preheater. The upper limit of heating temperature of the DIP component is around 150° C. When the circuit board 14 is preheated more than 120° C., temperature of the DIP component 12 may be greater than its upper limit (150° C.). Hence, the preheating temperature of the circuit board 14 by the preheater 20 is normally smaller than 120° C.

Then, the cleaner 26 is actuated for exhausting the smoke generated from the boiler 22 when the circuit board 14 enters the second section S2. After the track 16 conveys the circuit board 14 to the second section S2, the first surface 141 of the circuit board 14 passes through the boiler 22. Meanwhile, the molten tin from the boiler 22 flows between the DIP component 12 and the circuit board 14 through the first surface 141 of the circuit board 14. For increasing the soldering efficiency of the molten tin inside the circuit board 14, the soldering system 10 of the present invention utilizes the thermal radiation heating device 24 to heat the second surface 143 of the circuit board 14, so as to increase the temperature of the second surface 143 for preventing the temperature of the second surface 143 from being much smaller than the temperature of the first surface 141.

When the molten tin flows between the DIP component 12 and the circuit board 14 through the first surface 141 of the circuit board 14, the molten tin solidifies rapidly and does not flow deeply into a gap between the DIP component 12 and the circuit board 14 as the temperature of the first surface 141 is much greater than the temperature of the second surface 143 of the circuit board 14. On the other hand, as the temperature of the first surface 141 of the circuit board 14 is substantially equal to the temperature of the second surface 143, the molten fin from the boiler 22 can effectively go deeply into the gap between the DIP component 12 and the circuit board 14 before the molten fin is solidified, so that the soldering efficiency of the soldering system 10 of the present invention can be increased, such as being greater than about 150 percents of an efficiency of the conventional soldering system without the thermal radiation heating device, and soldering quality of the present invention can be enhanced correspondingly. Thus, the thermal radiation heating device 24 of the present invention can heat the other side of the circuit board 14 opposite to the boiler 22 (which means the second surface 143) when the circuit board 14 enters the second section S2 and the molten tin from the boiler 22 flows between the DIP component 12 and the circuit board 14, so as to keep the temperature of the second surface 143 close to the temperature of the first surface 141.

It should be mentioned that temperature of the molten tin from the boiler 22 is around 268° C., so that the thermal radiation heating device 24 heats the second surface 143 of the circuit board 14 to 268° C., so as to ensure the temperature of the second surface 143 is close to the temperature of the first surface 141. However, the upper limit of heating temperature of the DIP component 12 is 150° C. Accordingly, the shelter 28, the transmission roller 29, the position sensor 30 and the driving device 32 of the soldering system 10 are for heating the area on the second surface 143 of the circuit board 14 around the DIP component 12 with the thermal radiation heating device 24. Amounts, shapes and dimensions of the holes 281 on the shelter 28 correspond to amounts, shapes and dimensions of the DIP component 12 piercing through the circuit board 14. The shelter 28 is disposed between the thermal radiation heating device 24 and the circuit board 14, so that heat radiation generated by the thermal radiation heating device 24 can heat the predetermined area (which means the area on the second surface 143 of the circuit board 14 adjacent to the DIP component 12) on the circuit board 14 through the holes 281, and does not heat areas on the second surface 143 of the circuit board 14 where the DIP component is not located.

In addition, the circuit board 14 is conveyed by the track 16, and the position sensor 30 can detect the position of the circuit board 14 relative to the boiler 22 on the track 16. Then, the driving device 32 can drive the transmission roller 29 to move the shelter 28 and the thermal radiation heating device 24 relative to the circuit board 14 according to the detecting result of the position sensor 30. Rotary speed of the shelter 28 corresponds to conveying speed of the circuit board 14 conveyed by the track 16, so that the thermal radiation heating device 24 can continuously heat the predetermined area on the circuit board 14 (the area adjacent to the DIP component 12 as shown in FIG. 1) through the hole 281 on the shelter 28. Therefore, the soldering system 10 of the present invention can heat the second surface 143 for decreasing temperature difference between the two surfaces of the circuit board 14, so as to increase the soldering efficiency of the molten tin inside the circuit board 14.

Comparing to the prior art, the soldering system of the present invention utilizes the thermal radiation heating device to heat the dissipating surface (the second surface) of the circuit board when the soldering surface (the first surface) of the circuit board passes through the boiler, so as to decrease the temperature difference of the two surfaces of the circuit board for increasing the soldering efficiency. Because the heating temperature of the thermal radiation heating device is greater than the heatproof temperature of the DIP component, the soldering system of the present invention disposes the shelter between the thermal radiation heating device and the circuit board for protecting the area on the circuit board without soldering. Heat generated by the thermal radiation heating device is transmitted by radiation, so the thermal radiation heating device can heat the soldering area (the area on the circuit board around the DIP component) through the holes on the shelter accurately, and electronic components disposed on the area without soldering are not heated and destroyed. In addition, the position sensor and the driving device of the soldering system can move the thermal radiation heating device and the shelter relative to the circuit board according to the position of the circuit board relative to the boiler, so that the thermal radiation heating device can continuously heat the soldering area on the circuit board when the circuit board is within the second section of the track, so as to increase the soldering efficiency of the soldering system of the present invention.

Those skilled in the art will readily observe that numerous modifications and alterations of the device and method may be made while retaining the teachings of the invention.

What is claimed is:

1. A method of soldering a direct insertion process (DIP) component on a circuit board, comprising:
   piercing the DIP component through the circuit board;
   laying fluxer on the circuit board;
   passing a first surface of the circuit board through a boiler so that molten tin from the boiler flows between the DIP component and the circuit board through the first surface of the circuit board;
   disposing a shelter between a thermal radiation heating device and the circuit board;
   utilizing a position sensor to detect a position of the circuit board relative to the boiler;
   utilizing a driving device to rotate the shelter and to move the shelter and the thermal radiation heating device relative to the circuit board according to a detecting result of the position sensor, wherein a rotary speed of the shelter corresponds to a conveying speed of the circuit board so that a hole on the shelter continuously aims at an area on a second surface different from the first surface of the circuit board adjacent to the DIP component; and
   heating the area on the second surface different from the first surface of the circuit board adjacent to the DIP component through the hole on the shelter continuously by the thermal radiation heating device for increasing a temperature of the second surface when the first surface of the circuit board is passing through the boiler and the molten tin from the boiler is flowing between the DIP component and the circuit board through the first surface of the circuit board, to make the temperature of the second surface of the circuit board be substantially equal to a temperature of the first surface of the circuit board so that the molten tin from the boiler goes deeply into a gap between the DIP component and the circuit board before the molten tin is solidified.

2. The method of claim 1, further comprising:
   actuating a cleaner to exhaust smoke generated from the boiler when the first surface of the circuit board passes through the boiler.

3. The method of claim 1, further comprising:
   preheating the circuit board by a preheater before the circuit board passes through the boiler.

4. The method of claim 3, wherein preheating temperature of the circuit board by the preheater is smaller than heating temperature of the circuit board by the thermal radiation heating device.

* * * * *